(12) United States Patent
Sutardja

(10) Patent No.: US 8,716,875 B2
(45) Date of Patent: *May 6, 2014

(54) WINDOW BALL GRID ARRAY (BGA) SEMICONDUCTOR PACKAGES

(71) Applicant: Marvell World Trade Ltd., St. Michael (BB)

(72) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/745,491

(22) Filed: Jan. 18, 2013

(65) Prior Publication Data

US 2013/0127051 A1 May 23, 2013

Related U.S. Application Data

(63) Continuation of application No. 12/969,171, filed on Dec. 15, 2010, now Pat. No. 8,358,002.

(60) Provisional application No. 61/322,262, filed on Apr. 8, 2010, provisional application No. 61/289,943, filed on Dec. 23, 2009.

(51) Int. Cl.
*H01L 23/29* (2006.01)
*H01L 23/10* (2006.01)
*H01L 21/00* (2006.01)

(52) U.S. Cl.
USPC ........... 257/790; 257/693; 257/698; 257/706; 257/787; 257/788; 257/E23.011; 257/E23.068; 257/E23.116; 438/106; 438/108; 438/122; 438/127

(58) Field of Classification Search
USPC ................... 257/698, 787, E23.011–E23.194
See application file for complete search history.

(56) References Cited

U.S. PATENT DOCUMENTS 6,459,163 B1 10/2002 Bai
2006/0145362 A1 7/2006 Chang et al.

*Primary Examiner* — Jasmine Clark

(57) ABSTRACT

A semiconductor package includes a substrate having a first surface, a second surface that is opposite to the first surface, and an opening formed between the first surface of the substrate and the second surface of the substrate. One or more bonding wires electrically couple a first surface of a semiconductor die included in the semiconductor package to the first surface of the substrate through an opening of the substrate. A first electrically insulative structure is disposed to substantially fill an area between the first surface of the semiconductor die, the second surface of the substrate, and one or more interconnect bumps that electrically couple the semiconductor die to the substrate. The first electrically insulative structure substantially encapsulates the one or more bonding wires and substantially fills the opening of the substrate.

20 Claims, 6 Drawing Sheets

WINDOW BALL GRID ARRAY (BGA) SEMICONDUCTOR PACKAGES

CROSS REFERENCE TO RELATED APPLICATIONS

The present disclosure is a continuation of and claims priority to U.S. patent application Ser. No. 12/969,171, filed Dec. 15, 2010, now U.S. Pat. No. 8,358,002, issued Jan. 22, 2013, which claims priority to U.S. Provisional Patent Application No. 61/322,262, filed Apr. 8, 2010, and to U.S. Provisional Patent Application No. 61/289,943, filed Dec. 23, 2009, which are incorporated herein by reference.

TECHNICAL FIELD

Embodiments of the present disclosure relate to the field of integrated circuits, and more particularly, to semiconductor packaging techniques, structures, and configurations for window ball-grid array (BGA) semiconductor packages.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, window BGA packages are formed by using an adhesive to directly attach a semiconductor die to the substrate without using, for example, interconnect bumps or analogous structures. However, such conventional packaging may not provide a sufficiently small semiconductor package to accommodate shrinking form factors for emerging electronic devices such as, for example, phones, computers, or other electronic assemblies that use the semiconductor dies.

SUMMARY

In one embodiment, a semiconductor package includes a substrate having (i) a first surface, (ii) a second surface that is opposite to the first surface, and (iii) an opening formed between the first surface of the substrate and the second surface of the substrate. The semiconductor package further includes a semiconductor die having (i) a first surface and (ii) a second surface that is opposite to the first surface, the first surface of the semiconductor die being electrically coupled to the second surface of the substrate by one or more interconnect bumps; one or more bonding wires that electrically couple the first surface of the semiconductor die to the first surface of the substrate through the opening of the substrate; and a first electrically insulative structure disposed to substantially fill an area between the first surface of the semiconductor die, the second surface of the substrate, and the one or more interconnect bumps. The first electrically insulative structure substantially encapsulates the one or more bonding wires and substantially fills the opening of the substrate.

In another embodiment, a method includes providing a substrate having (i) a first surface, (ii) a second surface that is opposite to the first surface, and (iii) an opening formed between the first surface of the substrate and the second surface of the substrate; electrically coupling a semiconductor die to the substrate to form a semiconductor package, the semiconductor die having (i) a first surface and (ii) a second surface that is opposite to the first surface, the first surface of the semiconductor die being electrically coupled to the second surface of the substrate by one or more interconnect bumps; forming one or more bonding wires to electrically couple the first surface of the semiconductor die to the first surface of the substrate through the opening of the substrate; and forming an electrically insulative structure to substantially fill an area between the first surface of the semiconductor die, the second surface of the substrate, and the one or more interconnect bumps, wherein the electrically insulative structure substantially encapsulates the one or more bonding wires and substantially fills the opening of the substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe semiconductor packaging techniques, structures, and configurations for window ball-grid array (BGA) semiconductor packages. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, front/back, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
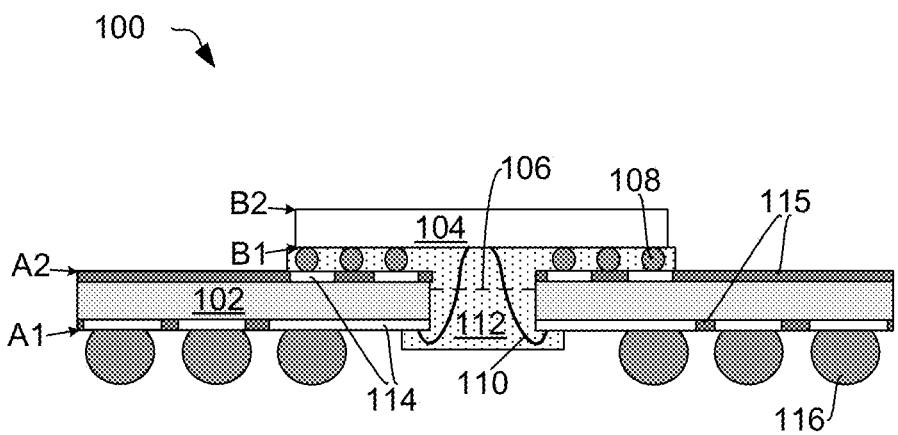
FIG. 1 schematically illustrates a first semiconductor package, in accordance with various embodiments.

FIG. 1 schematically illustrates a first semiconductor package 100, in accordance with various embodiments. The first semiconductor package 100 and other semiconductor packages described herein are generally arranged in a window BGA configuration. The first semiconductor package 100 includes a substrate 102 and a semiconductor die 104, coupled as shown. The substrate 102 has a first surface, A1, and a second surface, A2, that is opposite to the first surface A1. An opening 106, also referred to as a "window", is formed between the first surface A1 and the second surface A2 of the substrate 102 to facilitate routing of electrical signals, such as input/output (I/O) signals or power/ground, between the semiconductor die 104 and the substrate 102 via one or more bonding wires 110.

The semiconductor die 104 has a first surface, B1, and a second surface, B2, that is opposite to the first surface B1 as shown. According to various embodiments, the first surface B1 is an active surface of the semiconductor die 104 upon which a plurality of integrated circuit (IC) devices (not shown) such as transistors for a processor and/or memory are formed. The first surface B1 of the semiconductor die 104 is electrically coupled to the second surface A2 of the substrate 102 using one or more interconnect bumps 108. The one or more interconnect bumps 108 are coupled to a peripheral portion of the semiconductor die 104, as shown. The one or more interconnect bumps 108 can include any of a variety of suitable posts, balls, studs, or other similar structures to electrically couple the semiconductor die 104 and the substrate 102. In an embodiment, the one or more interconnect bumps 108 are used to route most or all power and/or ground connections between the semiconductor die 104 and the substrate 102 to provide a more robust power supply than bonding wires.

The first surface B1 of the semiconductor die 104 is further electrically coupled to the first surface A1 of the substrate 102 using the one or more bonding wires 110 that pass through the opening 106, as shown. The one or more bonding wires 110 are directly coupled to a central portion of the semiconductor die 104 and further directly coupled to the first surface A1 of the substrate 102, as shown. One or more electrically conductive structures such as wirebond pads (not shown in order to avoid obscuring the figures with too many details) may be disposed on the surfaces of the semiconductor die 104 and the substrate 102 to facilitate attachment of the one or more bonding wires 110. In an embodiment, the one or more bonding wires 110 are used to route most or all I/O signals between the semiconductor die 104 and the substrate 102. In another embodiment, where the first semiconductor package 100 is used to implement devices, such as, a dynamic random access memory (DRAM) or a system-on-chip (SoC), the one or more interconnect bumps 108 and the bonding wires 110 are used respectively to route signals having different speeds. For example, the one or more interconnect bumps 108 can be used to route high speed data while the bonding wires 110 can be used to route signals having a relatively lower speed.

Additional electrically conductive structures, such as, for example, traces 114, can be formed on the first surface A1 and the second surface A2 of the substrate 102 to facilitate routing of electrical connections between the semiconductor die 104 and the substrate 102. For example, the traces 114 formed on the first surface A1 of the substrate 102 can be used to route electrical connections between the one or more bonding wires 110 and one or more package interconnect structures, such as one or more solder balls 116. In one embodiment, the traces 114 fan out to electrically couple the one or more bonding wires 110 to corresponding solder ball(s) of the one or more solder balls 116. The one or more solder balls 116 are coupled to the first surface A1 of the substrate 102 to provide an electrical pathway between the first semiconductor package 100 and another electronic device (not shown), such as a motherboard or other circuit board, that is external to the first semiconductor package 100. It should be further noted that the substrate 102 may include multilayer substrates.

The traces 114 formed on the second surface A2 of the substrate 102 can be electrically coupled to the one or more package interconnect structures (e.g., one or more solder balls 116) using, for example, via structures (not shown) formed between the first surface A1 and the second surface A2 of the substrate 102 or any other suitable redistribution scheme. Thus, electrical signals including I/O signals and/or power for the semiconductor die 104 can be routed to the one or more solder balls 116 using the one or more interconnect bumps 108, the one or more bonding wires 110, and the traces 114. The one or more interconnect bumps 108, the one or more bonding wires 110, and the traces 114 can include any of a variety of electrically conductive materials, including, for example, metals such as gold (Au), copper (Cu), aluminum (Al), metal alloys, and/or solderable materials. Other electrically conductive materials can be used to form the one or more interconnect bumps 108, the one or more bonding wires 110 and the traces 114 in other embodiments.

A solder mask 115 or analogous structure can be formed on the first surface A1 and the second surface A2 of the substrate 102 to provide electrical isolation and/or physical protection for the traces 114. The solder mask 115 generally comprises an electrically insulative material such as a polymer.

An electrically insulative structure 112 comprising a molding compound, encapsulant, or underfill material, is formed to substantially fill an area between the first surface B1 of the semiconductor die 104, the second surface A2 of the substrate 102, and the one or more interconnect bumps 108, as shown. The electrically insulative structure 112 also substantially encapsulates the one or more bonding wires 110 and substantially fills the opening 106 of the substrate 102, as shown.

In an embodiment, the electrically insulative structure 112 is a molding compound material comprising thermosetting resins that are deposited in solid form (e.g., a powder) and subjected to heat and/or pressure to substantially fill the areas as described and shown. In another embodiment, the electrically insulative structure 112 is an underfill material that is deposited in liquid form by a liquid dispensing or injection process. The electrically insulative structure 112 can include, for example, an epoxy or any other suitable electrically insulative material.

According to various embodiments, the first semiconductor package 100 is a final product semiconductor package having an exposed semiconductor die 104. In other embodiments, the first semiconductor package 100 is an intermediary semiconductor package during a semiconductor package fabrication process. For example, the first semiconductor package 100 can be an intermediary semiconductor package during a semiconductor package fabrication process for the second semiconductor package 200 of FIG. 2 and/or the fifth semiconductor package 500 of FIG. 5.

Figure 2:
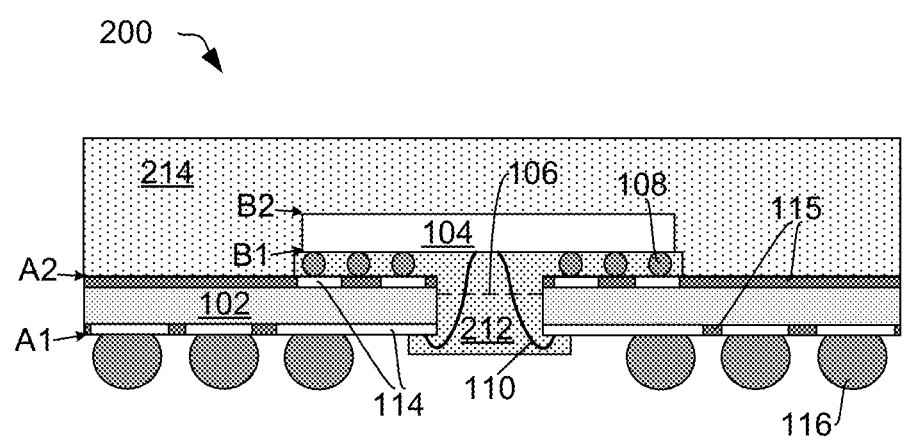
FIG. 2 schematically illustrates a second semiconductor package, in accordance with various embodiments.

FIG. 2 schematically illustrates a second semiconductor package 200, in accordance with various embodiments. The second semiconductor package 200 includes a substrate 102 having an opening 106 formed between the first surface A1 and the second surface A2 of the substrate 102, a semiconductor die 104, one or more interconnect bumps 108, one or more bonding wires 110, traces 114, solder mask 115, and solder balls 116 as described in connection with the first semiconductor package 100.

The second semiconductor package 200 further includes a first insulative structure 212 and a second insulative structure 214, configured as shown. According to various embodiments, the first insulative structure 212 includes an underfill material (e.g., formed by a liquid dispensing technique) and the second insulative structure 214 includes a molding compound material (e.g., formed by depositing a thermosetting resin in solid form and applying heat and/or pressure). In some embodiments, the molding compound material is not the same material as the underfill material.

The first insulative structure 212 is disposed to substantially fill an area between the first surface B1 of the semiconductor die 104, the second surface A2 of the substrate 102, and the one or more interconnect bumps 108, as shown. The first insulative structure 212 is further disposed to substantially encapsulate the one or more bonding wires 110 and substantially fill the opening 106 of the substrate 102. The second insulative structure 214 is coupled to the second surface A2 of the substrate 102 and to the second surface B2 of the semiconductor die 104 to substantially encapsulate the semiconductor die 104, as shown. The second semiconductor package 200 can be formed, for example, by depositing the second insulative structure 214 onto the first semiconductor package 100 of FIG. 1.

According to various embodiments, the second semiconductor package 200 is a final product semiconductor package having a first insulative structure 212 to provide an underfill for the semiconductor die 104 and a second insulative structure 214 to provide an encapsulating molding compound for the semiconductor die 104. In other embodiments, the second semiconductor package 200 is an intermediary semiconductor package during a semiconductor package fabrication process. For example, the second semiconductor package 200 can be an intermediary semiconductor package during a semiconductor package fabrication process for the fifth semiconductor package 500 of FIG. 5.

Figure 3:
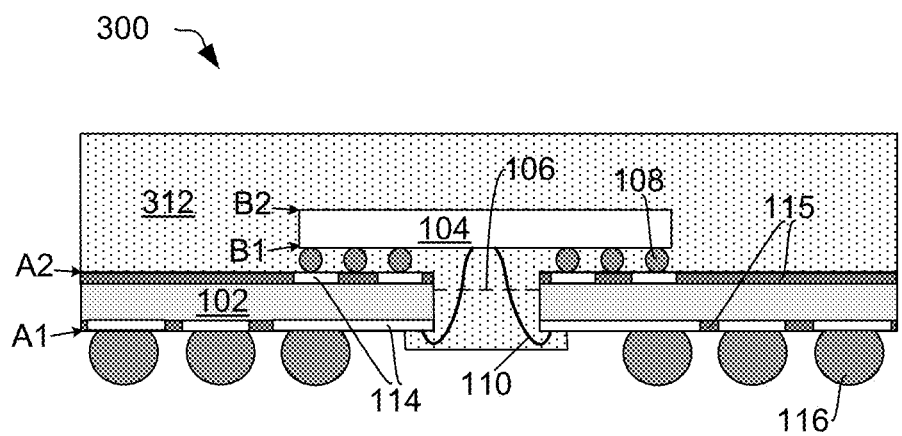
FIG. 3 schematically illustrates a third semiconductor package, in accordance with various embodiments.

FIG. 3 schematically illustrates a third semiconductor package 300, in accordance with various embodiments. The third semiconductor package 300 includes a substrate 102 having an opening 106 formed between the first surface A1 and the second surface A2 of the substrate 102, a semiconductor die 104, one or more interconnect bumps 108, one or more bonding wires 110, traces 114, solder mask 115, and solder balls 116 as described in connection with the first semiconductor package 100.

The third semiconductor package 300 further includes an insulative structure 312 that comprises a molding compound. The insulative structure 312 is formed by depositing a molding compound material in solid form (e.g., a powder) to a pre-formed pattern or mold and applying heat and/or pressure to cause the molding compound material to flow and form the insulative structure 312, as shown. The molding compound material of the insulative structure 312 substantially fills an area between the first surface B1 of the semiconductor die 104, the second surface A2 of the substrate 102, and the one or more interconnect bumps 108, as shown. The molding compound material of the insulative structure 312 is further disposed to substantially encapsulate the one or more bonding wires 110 and substantially fill the opening 106 of the substrate 102. The molding compound material of the insulative structure 312 is further coupled to the second surface A2 of the substrate 102 and to the second surface B2 of the semiconductor die 104 to substantially encapsulate the semiconductor die 104. Using a molding compound material to encapsulate the semiconductor die 104 and fill the underfill region may reduce a number of process operations and reduce costs associated with manufacturing the third semiconductor package 300.

According to various embodiments, the third semiconductor package 300 is a final product semiconductor package having an insulative structure 312 comprising only a molding compound material that encapsulates the semiconductor die 104 and fills an underfill region between the semiconductor die 104 and the substrate 102. In other embodiments, the third semiconductor package 300 is an intermediary semiconductor package during a semiconductor package fabrication process. For example, the third semiconductor package 300 can be an intermediary semiconductor package during a semiconductor package fabrication process for the fourth semiconductor package 400 of FIG. 4.

Figure 4:
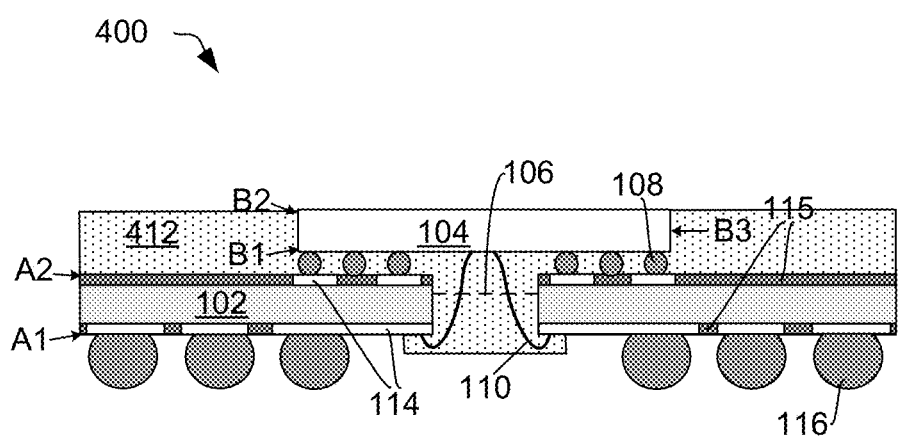
FIG. 4 schematically illustrates a fourth semiconductor package, in accordance with various embodiments.

FIG. 4 schematically illustrates a fourth semiconductor package 400, in accordance with various embodiments. The fourth semiconductor package 400 includes a substrate 102 having an opening 106 formed between the first surface A1 and the second surface A2 of the substrate 102, a semiconductor die 104, one or more interconnect bumps 108, one or more bonding wires 110, traces 114, solder mask 115, and solder balls 116 as described in connection with the first semiconductor package 100.

The fourth semiconductor package 400 further includes an electrically insulative structure 412. The electrically insulative structure 412 can include a molding compound, encapsulant, or underfill material. In one embodiment, the electrically insulative structure 412 comprises a molding compound.

The electrically insulative structure 412 substantially fills an area between the first surface B1 of the semiconductor die 104, the second surface A2 of the substrate 102, and the one or more interconnect bumps 108, as shown. The insulative structure 412 is further disposed to substantially encapsulate the one or more bonding wires 110 and substantially fill the opening 106 of the substrate 102. The insulative structure 412 is further coupled to the second surface A2 of the substrate 102 and to a surface, B3, of the semiconductor die 104 that is substantially perpendicular to the second surface B2 of the semiconductor die, as shown.

The electrically insulative structure 412 is substantially planar with the second surface B2 of the semiconductor die 104. The second surface B2 of the semiconductor die 104 is exposed. That is, the electrically insulative structure 412 is not disposed on the second surface B2 of the semiconductor die 104. The fourth semiconductor package 400 can be formed, for example, by removing material of the electrically insulative structure 312 of the third semiconductor package 300 of FIG. 3 using a polishing process to expose the second surface B2 of the semiconductor die 104 and to provide a planar surface, as shown in FIG. 4. Alternatively, the second surface B2 of the semiconductor die 104 may be exposed using an exposed die molding system.

According to various embodiments, the fourth semiconductor package 400 is a final product semiconductor package having an insulative structure 412 comprising only a molding compound material that is planar with a backside (e.g., the second surface B2) of the semiconductor die 104, such that the backside is exposed. In other embodiments, the fourth semiconductor package 400 is an intermediary semiconductor package during a semiconductor package fabrication process. For example, another component such as a heat sink (not shown) can be coupled to the exposed second surface B2 of the semiconductor die 104 to facilitate heat removal from the fourth semiconductor package 400.

Figure 5:
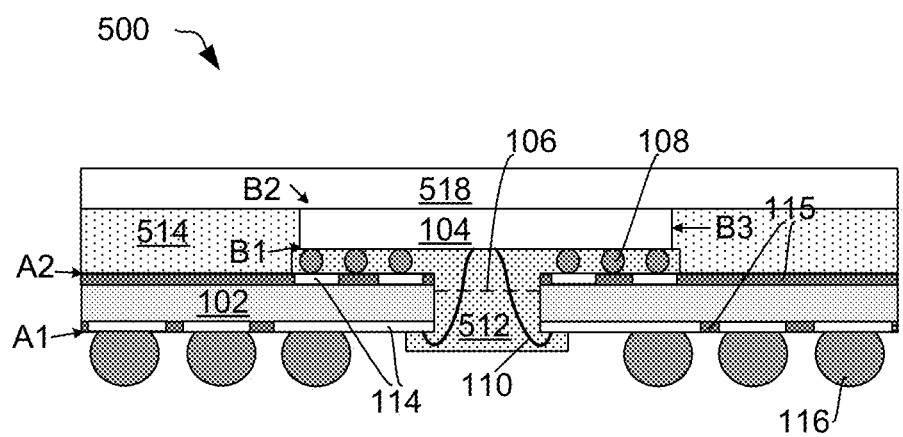
FIG. 5 schematically illustrates a fifth semiconductor package, in accordance with various embodiments.

FIG. 5 schematically illustrates a fifth semiconductor package 500, in accordance with various embodiments. The fifth semiconductor package 500 includes a substrate 102 having an opening 106 formed between the first surface A1 and the second surface A2 of the substrate 102, a semiconductor die 104, one or more interconnect bumps 108, one or more bonding wires 110, traces 114, solder mask 115, and solder balls 116 as described in connection with the first semiconductor package 100.

The fifth semiconductor package 500 further includes a first electrically insulative structure 512 comprising an underfill material and a second electrically insulative structure 514 comprising a molding compound material. The first electrically insulative structure 512 substantially fills an area between the first surface B1 of the semiconductor die 104, the second surface A2 of the substrate 102, and the one or more interconnect bumps 108, as shown. The first insulative structure 512 is further disposed to substantially encapsulate the one or more bonding wires 110 and substantially fill the opening 106 of the substrate 102.

The second electrically insulative structure 514 is coupled to the second surface A2 of the substrate 102 and to a surface, B3, of the semiconductor die 104 that is substantially perpendicular to the second surface B2 of the semiconductor die, as shown. The second electrically insulative structure 514 is substantially planar with the second surface B2 of the semiconductor die 104. The second the electrically insulative structure 514 is not disposed on the second surface B2 of the semiconductor die 104. The fifth semiconductor package 500 can be formed, for example, by removing material of the second electrically insulative structure 214 of the second semiconductor package 200 of FIG. 2 using a polishing process to expose the second surface B2 of the semiconductor die 104 and to provide a substantially planar surface, as shown in FIG. 4.

The fifth semiconductor package 500 further includes a heat sink 518 coupled to the second surface B2 of the semiconductor die 104. The heat sink 518 facilitates removal of heat away from the fifth semiconductor package 500. In one embodiment, the heat sink 518 is larger than the semiconductor die 104 to provide better thermal dissipation and is roughly the same size dimensionally as the semiconductor package 500. The heat sink 518 may have a flat top surface, but alternatively, may also include other configurations, such as, a corrugated configuration, to maximize the surface area for heat dissipation.

According to various embodiments, the fifth semiconductor package 500 is a final product semiconductor package. To be clear, embodiments described in connection with the semiconductor packages of FIGS. 1-5 can be suitably combined in other embodiments. For example, the fifth semiconductor package 500 can be a final product semiconductor package without the heat sink 518. That is, the fifth semiconductor package 500 of FIG. 5 can have an exposed die backside (e.g., second surface B2 of semiconductor die 104) in the final product semiconductor package. Other embodiments that suitably combine aspects of the semiconductor packages of FIGS. 1-5 are envisioned and fall within the scope of this disclosure.

Figure 6:
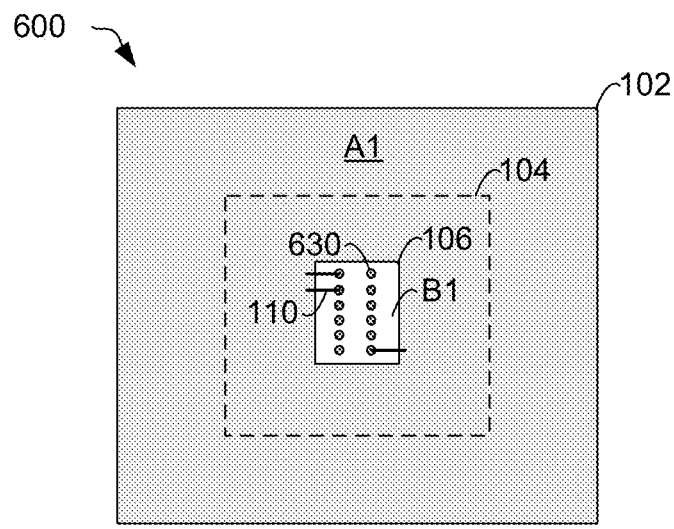
FIG. 6 schematically illustrates a bottom view of a semiconductor package of the kind depicted in FIGS. 1-5, in accordance with various embodiments.

FIG. 6 schematically illustrates a bottom view of a semiconductor package 600 of the kind depicted in FIGS. 1-5, in accordance with various embodiments. Solder balls 116, traces 114, solder mask 115, and various electrically insulative structures (e.g., the electrically insulative structures 112, 212, 312, 412, and 512) as described in connection with FIGS. 1-5, are omitted in this bottom view of the semiconductor package 600 to avoid obscuring the figure with too many details.

The semiconductor die 104 is represented by a dashed rectangle to indicate that a portion of the semiconductor die 104 behind the substrate 102 is not visible in the bottom view of FIG. 6. The first surface B1 of the semiconductor die 104 is visible within the opening 106 formed in the substrate 102.

One or more wirebond pads 630 are disposed on the first surface B1 of the semiconductor die 104 to facilitate attachment of the one or more bonding wires 110 to the semiconductor die 104. In an embodiment, the one or more wirebond pads 630 within the opening 106 are configured to route most or all I/O signals for the semiconductor die 104. Generally, the one or more bonding wires 110 are directly coupled to the one or more wirebond pads 630 and further directly coupled to analogous structures such as pads (not shown) or traces (e.g., 114 of FIGS. 1-5) disposed on the first surface A1 of the substrate 102, which may further route the electrical signals to package interconnect structures (e.g., solder balls 116 of FIGS. 1-5) disposed on the first surface A1 of the substrate 102.

According to various embodiments, the semiconductor die 104 comprises a first rectangular shape having a first area, as shown by the dashed line, and the opening 106 of the substrate comprises a second rectangular shape having a second area, as shown. When the second area is overlaid with the first area, as depicted in the bottom view of the semiconductor package 600 of FIG. 6, the second area is completely disposed within the first area. Further, when the second area is overlaid with the first area, the second area is substantially centered within the first area. The sides of the first rectangular shape and the second rectangular shape are substantially parallel, as shown.

Figure 7:
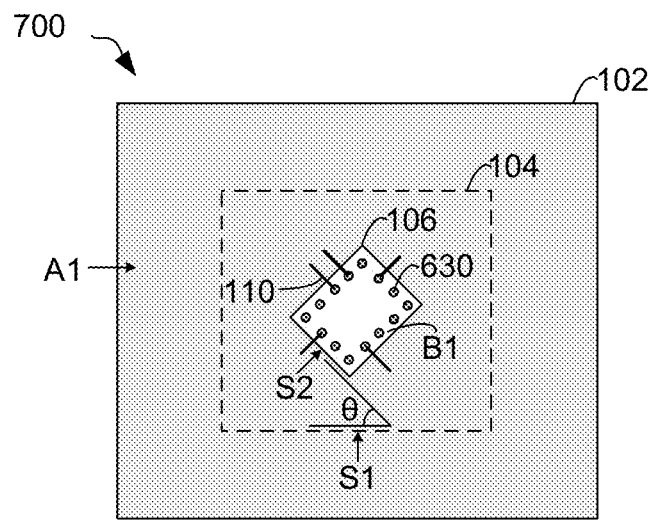
FIG. 7 schematically illustrates a bottom view of another semiconductor package of the kind depicted in FIGS. 1-5, in accordance with various embodiments.

FIG. 7 schematically illustrates a bottom view of another semiconductor package 700 of the kind depicted in FIGS. 1-5, in accordance with various embodiments. The semiconductor package 700 of FIG. 7 includes the features as described in connection with the semiconductor package 600 of FIG. 6, except that the opening 106 in the substrate 102 of FIG. 7 is offset compared to the opening 106 in the substrate 102 of FIG. 6. According to some embodiments, the semiconductor package 700 includes one or more bonding wires 110 that are formed on all four sides of the opening 106, as shown. That is, the one or more bonding wires 110 are coupled to one or more wirebond pads 630 that are disposed along a length of each of the four sides of the opening 106.

According to various embodiments, the semiconductor die 104 comprises a first rectangular shape having a first area, as shown by the dashed line, and the opening 106 of the substrate comprises a second rectangular shape having a second area, as shown. When the second area is overlaid with the first area, as depicted in the bottom view of the semiconductor package 700 of FIG. 7, the second area is completely disposed within the first area. Further, when the second area is overlaid with the first area as shown, the second area is substantially centered within the first area. In the semiconductor package 700, a side (e.g., side S1) of the first rectangular shape is offset from a side (e.g., side S2) of the second rectangular shape by about 45 degrees, as represented by the angle, $\theta$, in FIG. 7.

Figure 8:
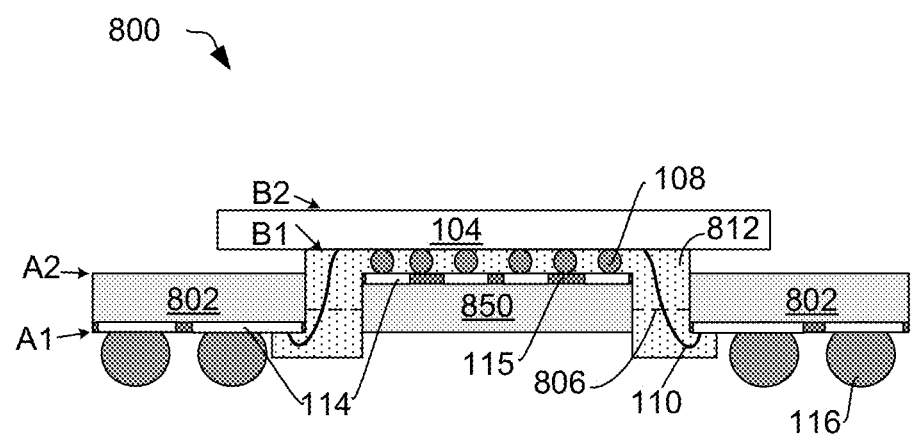
FIG. 8 schematically illustrates a sixth semiconductor package, in accordance with various embodiments.

FIG. 8 schematically illustrates a sixth semiconductor package 800, in accordance with various embodiments. The sixth semiconductor package 800 includes a substrate 802 such as, for example, a leadframe, having one or more openings 806 formed between a first surface A1 and a second surface A2 of the substrate 102 and a die paddle 850 that is configured to support a semiconductor die 104 disposed thereon. The die paddle 850 is substantially centered between peripheral portions of the substrate 802, as shown, and is structurally coupled to the peripheral portions of the substrate 802 using one or more tie bars (e.g., not shown in this view, but shown as one or more tie bars 975 of FIG. 9). The die paddle 850 and the one or more tie bars are part of a die support structure of the substrate 802.

The semiconductor die 104 is electrically coupled to the first surface A1 of the substrate 802 using one or more bonding wires 110 that pass through the one or more openings 806 of the substrate 802. The semiconductor die 104 is further electrically coupled to the second surface A2 of the substrate 802 (e.g., die paddle 850) using one or more interconnect bumps 108. The one or more bonding wires 110 and the one or more interconnect bumps 108 are used to route electrical signals such as, for example, I/O and/or power/ground signals, to or from the semiconductor die 104. In an embodiment, the one or more bonding wires 110 are used to route all or substantially all I/O signals for the semiconductor die 104 and the one or more interconnect bumps 108 are used to route all or substantially all power/ground connections for the semiconductor die 104. In another embodiment, where the semiconductor package 800 is used to implement devices, such as, a dynamic random access memory (DRAM) or a system-on-chip (SoC), the one or more interconnect bumps 108 and the bonding wires 110 are used respectively to route signals having different speeds. For example, the one or more interconnect bumps 108 can be used to route high speed data while the bonding wires 110 can be used to route signals having a relatively lower speed.

Traces 114 or analogous structures such as leads or bond fingers can be disposed on the first surface A1 and/or the second surface A2 of the substrate 802 to facilitate redistribution of the electrical signals. Solder mask 115 can be used to protect and/or electrically isolate the traces 114. One or more solder balls 116 are coupled to the first side A1 of the substrate 802 to further facilitate routing of the electrical signals to or from the sixth semiconductor package 800.

An electrically insulative structure 812 is disposed to substantially fill a region between the semiconductor die 104 and the die paddle 850 portion of the substrate 802 and to substantially fill the one or more openings 806 in the substrate 802, as shown. The electrically insulative structure 812 can comport with embodiments already described in connection with electrically insulative structure(s) described in connection with FIGS. 1-5. For example, the electrically insulative structure 812 can include a molding compound, encapsulant, or underfill material, or combinations thereof.

Figure 9:
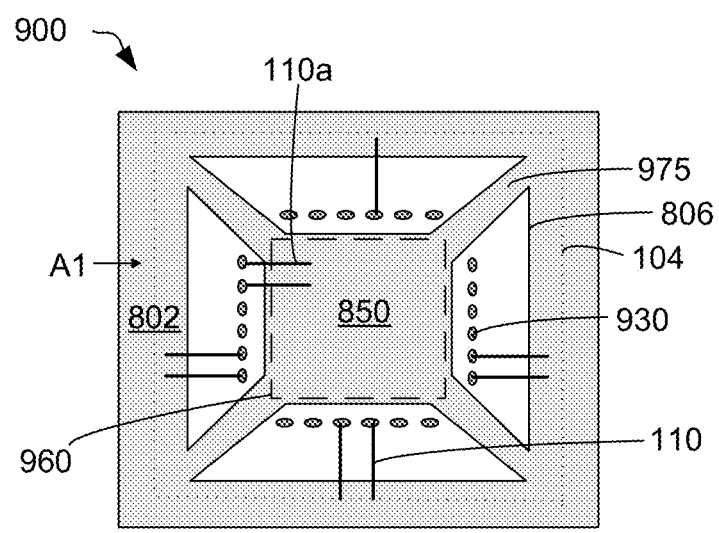
FIG. 9 schematically illustrates a bottom view of a semiconductor package of the kind depicted in FIG. 8, in accordance with various embodiments.

FIG. 9 schematically illustrates a bottom view of a semiconductor package 900 of the kind depicted in FIG. 8, in accordance with various embodiments. Solder balls 116, traces 114, solder mask 115, and the electrically insulative structure 812 as described in connection with FIG. 8 are omitted in this bottom view of the semiconductor package 900 for the sake of clarity.

The semiconductor package 900 includes the substrate 802 (e.g., the first surface A1 of the substrate 802 is shown in FIG. 9) having the die paddle 850 that is structurally coupled to a peripheral portion of the substrate 802 using one or more tie bars 975, as shown. The die paddle 850 and the one or more tie bars 975 are part of a die support structure of the substrate 802. The substrate 802 (e.g., including the die paddle 850 and the one or more tie bars 975) can be part of a single continuous structure in some embodiments.

The one or more openings 806 are disposed between a peripheral portion of the substrate 802 and the die paddle 850. The semiconductor die 104 is disposed on the die paddle 850 such that a central portion of the semiconductor die 104 is not visible through the die paddle 850 in the bottom view of FIG. 9. Dashed portions of the semiconductor die 104 indicate areas where the semiconductor die 104 is hidden from the bottom view by the one or more tie bars 975. A peripheral portion of the semiconductor die 104 is visible through the one or more openings 806. One or more wirebond pads 930 are disposed on the peripheral portion of the semiconductor die 104 to provide a connection site for the one or more bonding wires 110. The one or more bonding wires 110 are directly coupled to the one or more wirebond pads 930 and to corresponding pads (not shown) or traces (e.g., 114 of FIG. 8) disposed on the substrate 802. In an embodiment, the one or more bonding wires 110 are attached to each of four sides of the semiconductor die 104, as shown.

In some embodiments, additional one or more bonding wires 110a are directly coupled to the one or more wirebond pads 930 and directly coupled to the die paddle 850 and/or tie bars 975. To be clear, the one or more bonding wires 110 and additional one or more bonding wires 110a may be encapsulated with an electrically insulative structure (e.g., electrically insulative structure 812 of FIG. 8). In some embodiments, the die paddle 850 and/or tie bars provide ground and/or power supply for the semiconductor die 104.

According to various embodiments, the semiconductor die 104 comprises a first rectangular shape having a first area, as shown. The die paddle 850 comprises a second substantially rectangular shape (e.g., indicated by the dashed rectangle 960) having a second area, as shown. When the second area is overlaid with the first area, as depicted in the bottom view of the semiconductor package 900 of FIG. 9, the second area is completely disposed within the first area. Further, when the second area is overlaid with the first area as shown, the second area is substantially centered within the first area. Sides of the first rectangular shape and the second substantially rectangular shape are substantially parallel, as shown. Embodiments described in connection with FIGS. 8-9 can be suitably combined with embodiments described in connection with FIGS. 1-7.

Figure 10:
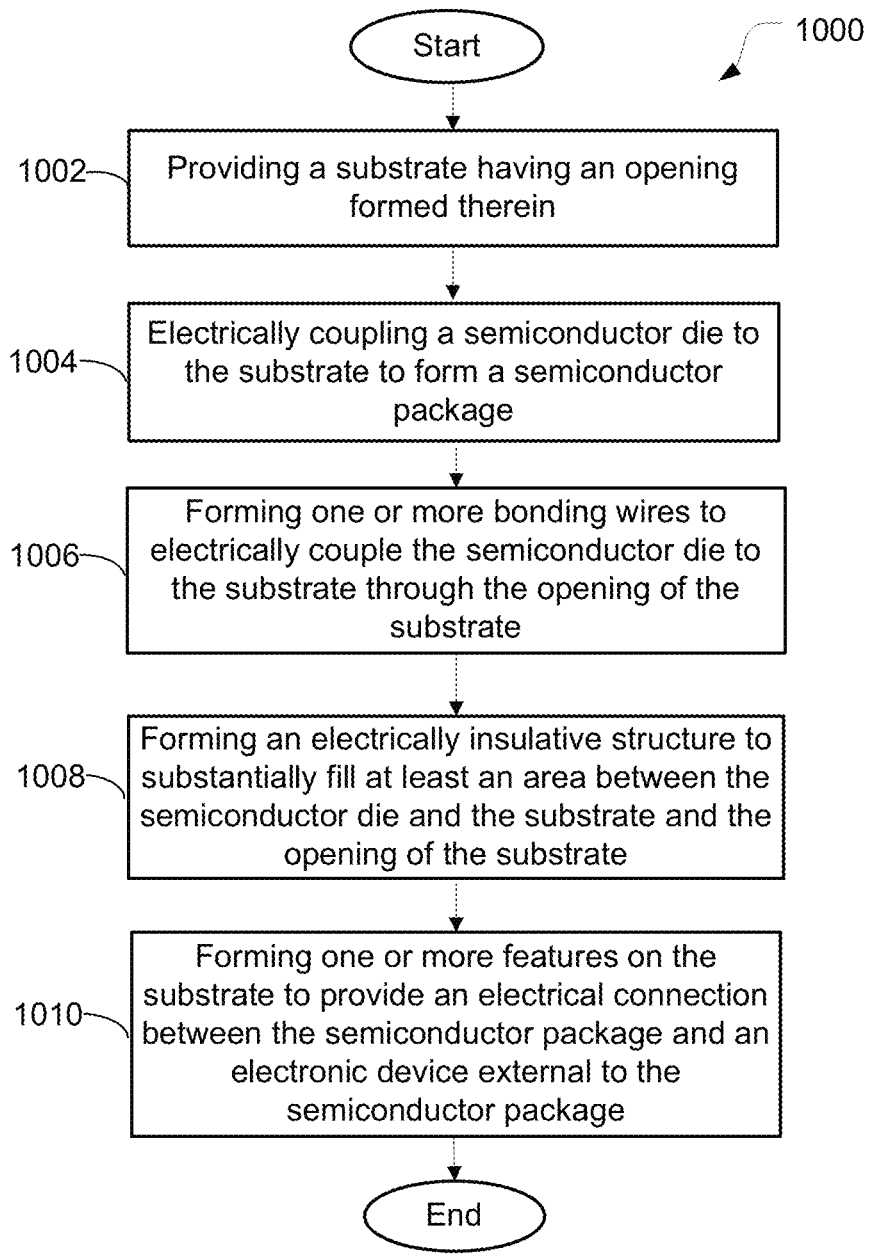
FIG. 10 is a process flow diagram of a method to fabricate a semiconductor package, in accordance with various embodiments.

FIG. 10 is a process flow diagram of a method 1000 to fabricate a semiconductor package, in accordance with various embodiments. At block 1002, the method 1000 includes providing a substrate (e.g., substrate 102 of FIGS. 1-7 or substrate 802 of FIGS. 8-9) having an opening (e.g., opening 106 of FIGS. 1-7 or one or more openings 806 of FIGS. 8-9). The opening is generally formed through opposing surfaces (e.g., surface A1 and surface A2 of FIGS. 1-9) to provide a pathway for electrical signals that are routed by wirebonding.

At block 1004, the method 1000 further includes electrically coupling a semiconductor die (e.g., semiconductor die 104 of FIGS. 1-9) to the substrate to form a semiconductor package (e.g., semiconductor package 100, 200, 300, 400, 500, 600, 700, 800, or 900 of respective FIGS. 1-9). In some embodiments, the semiconductor die is electrically coupled to the substrate using one or more interconnect bumps (e.g., one or more interconnect bumps 108 of FIGS. 1-5 and FIG. 8).

At block 1006, the method 1000 further includes forming one or more bonding wires (e.g., bonding wires 110 of FIGS. 1-9) to electrically couple the semiconductor die to the substrate through the opening of the substrate. The one or more bonding wires are generally attached to wirebond pads (e.g., wirebond pads 630 or 930 of FIGS. 6-7 and FIG. 9) that are disposed on the semiconductor die and/or substrate using a combination of heat, pressure, and/or ultrasonic energy to form a weld. The one or more bonding wires can be attached, for example, using a ball bonding or a wedge bonding process. According to various embodiments, the one or more bonding wires are used to route most or all of the I/O signals for the semiconductor die and the one or more interconnect bumps are used to route most or all of the power/ground signals for the semiconductor die.

At block 1008, the method 1000 further includes forming an electrically insulative structure (e.g., electrically insulative structures 112, 212, 214, 312, 412, 512, 514, and 812 of respective FIGS. 1-5 and FIG. 8) to substantially fill at least an area between the semiconductor die and the substrate and to further substantially fill the opening of the substrate. According to various embodiments, the electrically insulative structure is disposed to encapsulate the one or more bonding wires. The electrically insulative structure can include, for example, a molding compound, encapsulant, or underfill material, or combinations thereof, as described herein. For example, a molding compound can be formed by depositing a thermosetting resin in solid form, such as powder, to a pre-formed pattern or mold and applying heat and/or pressure to cause the thermosetting resin to form the electrically insulative structure(s) as depicted in FIGS. 1-5 and 8. In another example, an underfill material in liquid form is dispensed according to a liquid dispensing technique to form the electrically insulative structure(s) as depicted in FIGS. 1-5 and 8.

In an embodiment, an underfill material is deposited to substantially fill an area between the semiconductor die and the substrate and to further substantially fill the opening of the substrate (e.g., as depicted for the first electrically insulative structure 212 of FIG. 2). A molding compound is deposited to substantially encapsulate the semiconductor die (e.g., as depicted for the second electrically insulative structure 214 of FIG. 2), the molding compound being coupled to a top surface (e.g., second surface B2 of FIG. 2) of the semiconductor die and a top surface (e.g., first surface A2 of FIG. 2) the substrate. In other embodiments, a molding compound is formed to substantially fill an area between the semiconductor die and the substrate and to further substantially fill the opening of the substrate. The molding compound is further formed to substantially encapsulate the semiconductor die (e.g., as depicted for the electrically insulative structure 312 of FIG. 3).

Portions of the deposited electrically insulative material can be removed to form the electrically insulative structure(s). For example, electrically insulative material can be removed by a polishing process to expose a backside or top surface (e.g., second surface B2 of FIG. 4) of the semiconductor die such that the electrically insulative structure(s) is substantially planar with the second surface of the semiconductor die. A heat sink (e.g., heat sink 518 of FIG. 5) or other component can be coupled to the backside or the top surface of the semiconductor die to facilitate heat removal from the semiconductor package.

At block 1010, the method 1000 further includes forming one or more features (e.g., solder balls 116 of FIGS. 1-5 and FIG. 8) on the substrate to provide an electrical pathway between the semiconductor package and an electronic device, such as a motherboard or other circuit board, that is external to the semiconductor package. The one or more features are generally formed on a bottom surface (e.g., first surface A1 of FIGS. 1-9) of the semiconductor package and can include solder balls in a ball-grid array (BGA) type configuration.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A semiconductor package comprising:
   a substrate having (i) a first surface, (ii) a second surface that is opposite to the first surface, and (iii) an opening formed between the first surface of the substrate and the second surface of the substrate;
   a semiconductor die having (i) a first surface and (ii) a second surface that is opposite to the first surface, wherein at least a part of the first surface of the semiconductor die is attached to the second surface of the substrate;
   a bonding wire that electrically couples the first surface of the semiconductor die to the first surface of the substrate through the opening of the substrate;
   a first electrically insulative structure disposed to substantially fill the opening of the substrate, wherein the first electrically insulative structure substantially encapsulates the bonding wire; and
   a second electrically insulative structure that comprises a material different from a material of the first electrically insulative structure, wherein the second electrically insulative structure encapsulates at least a part of the second surface of the substrate.

2. The semiconductor package of claim 1, wherein:
   at least the part of the first surface of the semiconductor die is attached to the second surface of the substrate via one or more interconnect bumps.

3. The semiconductor package of claim 2, wherein:
   the first electrically insulative structure is disposed to substantially fill an area between the first surface of the semiconductor die, the second surface of the substrate, and the one or more interconnect bumps.

4. The semiconductor package of claim 1, wherein:
   the first electrically insulative structure comprises an underfill material.

5. The semiconductor package of claim 4, wherein:
   the second electrically insulative structure comprises a molding compound material.

6. The semiconductor package of claim 1, wherein:
   the semiconductor die comprises a third surface that is perpendicular to each of the first surface and the second surface; and
   the second electrically insulative structure encapsulates at least a part of the third surface of the semiconductor die.

7. The semiconductor package of claim 1, wherein:
the second electrically insulative structure encapsulates the second surface of the semiconductor die.

8. The semiconductor package of claim 1, wherein:
the second electrically insulative structure is substantially planar with the second surface of the semiconductor die; and
the second electrically insulative structure is not disposed on the second surface of the semiconductor die.

9. The semiconductor package of claim 8, further comprising:
a heat sink coupled to the second surface of the semiconductor die.

10. The semiconductor package of claim 1, further comprising:
one or more solder balls coupled to the first surface of the substrate, wherein the one or more solder balls provide an electrical pathway between the semiconductor package and an electronic device external to the semiconductor package; and
one or more traces formed on the first surface of the substrate to route electrical connections between the bonding wire and the one or more solder balls,
wherein the bonding wire provides an electrical connection for an input/output (I/O) signal to or from the semiconductor die.

11. A method comprising:
forming a substrate having (i) a first surface and (ii) a second surface that is opposite to the first surface;
forming an opening between the first surface of the substrate and the second surface of the substrate;
electrically coupling a semiconductor die to the substrate to form a semiconductor package, the semiconductor die having (i) a first surface and (ii) a second surface that is opposite to the first surface, wherein at least a part of the first surface of the semiconductor die is attached to the second surface of the substrate;
forming a bonding wire that electrically couples the first surface of the semiconductor die to the first surface of the substrate through the opening of the substrate;
disposing a first electrically insulative structure to substantially fill the opening of the substrate, wherein the first electrically insulative structure substantially encapsulates the bonding wire; and
disposing a second electrically insulative structure that comprises a material different from a material of the first electrically insulative structure, wherein the second electrically insulative structure encapsulates at least a part of the second surface of the substrate.

12. The method of claim 11, wherein:
at least the part of the first surface of the semiconductor die is attached to the second surface of the substrate via one or more interconnect bumps.

13. The method of claim 12, wherein:
the first electrically insulative structure is disposed to substantially fill an area between the first surface of the semiconductor die, the second surface of the substrate, and the one or more interconnect bumps.

14. The method of claim 11, wherein:
the first electrically insulative structure comprises an underfill material.

15. The method of claim 14, wherein:
the second electrically insulative structure comprises a molding compound material.

16. The method of claim 11, wherein:
the semiconductor die comprises a third surface that is perpendicular to each of the first surface and the second surface; and
the second electrically insulative structure encapsulates at least a part of the third surface of the semiconductor die.

17. The method of claim 11, wherein:
the second electrically insulative structure encapsulates the second surface of the semiconductor die.

18. The method of claim 11, wherein:
the second electrically insulative structure is substantially planar with the second surface of the semiconductor die; and
the second electrically insulative structure is not disposed on the second surface of the semiconductor die.

19. The method of claim 18, further comprising:
coupling a heat sink to the second surface of the semiconductor die.

20. The method of claim 11, further comprising:
coupling one or more solder balls to the first surface of the substrate, wherein the one or more solder balls provide an electrical pathway between the semiconductor package and an electronic device external to the semiconductor package; and
forming one or more traces on the first surface of the substrate to route electrical connections between the bonding wire and the one or more solder balls,
wherein the bonding wire provides an electrical connection for an input/output (I/O) signal to or from the semiconductor die.

* * * * *